United States Patent
Learmonth et al.

(10) Patent No.: US 12,104,423 B2
(45) Date of Patent: Oct. 1, 2024

(54) GARAGE DOOR OPENER BATTERY BACKUP SYSTEM

(71) Applicant: Nice North America LLC, Carlsbad, CA (US)

(72) Inventors: Darren Learmonth, Austin, TX (US); Jari Niemela, San Diego, CA (US); Gerald Dillon, Escondido, CA (US); Mark C. Mattson, Carlsbad, CA (US)

(73) Assignee: Nice North America LLC, Carlsbad, CA (US)

( * ) Notice: Subject to any disclaimer, the term of this patent is extended or adjusted under 35 U.S.C. 154(b) by 471 days.

(21) Appl. No.: 17/495,651

(22) Filed: Oct. 6, 2021

(65) Prior Publication Data
US 2023/0108988 A1    Apr. 6, 2023

(51) Int. Cl.
*E05F 15/668*    (2015.01)
*E05F 15/603*    (2015.01)
(Continued)

(52) U.S. Cl.
CPC .......... *E05F 15/668* (2015.01); *G01R 31/392* (2019.01); *E05F 15/603* (2015.01);
(Continued)

(58) Field of Classification Search
CPC ......... E05F 15/668; E05F 15/77; E05F 15/70; E05F 15/603; G01R 31/392;
(Continued)

(56) References Cited

U.S. PATENT DOCUMENTS

| 6,670,725 B2 | 12/2003 | Fitzgibbon et al. |
| 6,920,718 B2 | 7/2005 | Hom et al. |

(Continued)

FOREIGN PATENT DOCUMENTS

| CA | 3055685 A1 | 3/2020 |
| CN | 102315672 B | 4/2015 |

(Continued)

OTHER PUBLICATIONS

Venkatesan et al. ( Health monitoring and prognosis of electric vehicle motor using intelligent-digital twin. IET Electric Power Applications, Jun. 13, 2019, 13: 1328-1335. https://doi.org/10.1049/iet-epa.2018.5732) (Year: 2019).*

(Continued)

*Primary Examiner* — Manish S Shah
*Assistant Examiner* — Christian T Bryant
(74) *Attorney, Agent, or Firm* — Fox Rothschild LLP

(57) ABSTRACT

In one aspect, a garage door opener system includes a battery configured to be charged by a power source, a controller coupled to the battery, the controller configured to operate a motor that is powered only by the battery, at least one sensor coupled to the motor and the controller, the at least one sensor generating sensor data, and a battery monitoring system coupled to the battery, the controller, and the least one sensor, the battery monitoring system configured to monitor a power consumption of the battery and a state of the battery, and to update an operation configuration of the controller based on historical power consumption of the battery, the state of the battery, and the sensor data.

15 Claims, 12 Drawing Sheets

(51) Int. Cl.
*E05F 15/70* (2015.01)
*E05F 15/77* (2015.01)
*G01R 31/392* (2019.01)
*G06F 1/3203* (2019.01)
*H02J 9/06* (2006.01)

(52) U.S. Cl.
CPC .............. *E05F 15/70* (2015.01); *E05F 15/77* (2015.01); *E05Y 2400/36* (2013.01); *E05Y 2400/452* (2013.01); *E05Y 2400/502* (2013.01); *E05Y 2400/614* (2013.01); *E05Y 2900/106* (2013.01); *G06F 1/3203* (2013.01); *H02J 9/061* (2013.01)

(58) Field of Classification Search
CPC ........... E05Y 2400/36; E05Y 2400/452; E05Y 2400/502; E05Y 2400/614; E05Y 2900/106; H02J 9/061; G06F 1/3203
See application file for complete search history.

(56) References Cited

U.S. PATENT DOCUMENTS

| | | | |
|---|---|---|---|
| 7,382,063 | B2 | 6/2008 | Mullet et al. |
| 7,635,966 | B2 | 12/2009 | Butler |
| 7,656,129 | B2 | 2/2010 | Banta et al. |
| 9,525,308 | B1 | 12/2016 | Bullock et al. |
| 9,978,265 | B2 | 5/2018 | Mcnabb et al. |
| 10,253,545 | B2 | 4/2019 | Liu et al. |
| 10,388,094 | B2 | 8/2019 | Johnson |
| 10,443,266 | B2 | 10/2019 | Johnson et al. |
| 10,731,397 | B2 | 8/2020 | Tsui et al. |
| 10,855,106 | B2 | 12/2020 | Cochran |
| 2003/0063715 | A1 | 4/2003 | Peplinski |
| 2004/0194387 | A1 | 10/2004 | Hom et al. |
| 2010/0156182 | A1 | 6/2010 | Mertel et al. |
| 2015/0263651 | A1 | 9/2015 | Tehranchi |
| 2017/0356243 | A1* | 12/2017 | Feldstein .............. H02J 7/0024 |
| 2019/0080591 | A1* | 3/2019 | McNabb ............ G07C 9/00857 |
| 2020/0091763 | A1 | 3/2020 | Kippes |
| 2021/0350646 | A1* | 11/2021 | Burroughs ......... G07C 9/00571 |

FOREIGN PATENT DOCUMENTS

| | | |
|---|---|---|
| CN | 110417109 A | 11/2019 |
| DE | 19641592 C2 | 3/2003 |
| DE | 102008049832 A1 | 4/2010 |

OTHER PUBLICATIONS

Baker Door Company, "Garage door opener backup batteries: are they worth it?", [Online]. Retrieved from the Internet: <https://www.bakerdoorcompany.com/blog/garage-door-opener-backup-batteries>, (Sep. 13, 2019), 6 pages.

Krishna Park Infracon PVT. Ltd., "Automatic Parking Barriers & Parking Savers", [Online]. Retrieved from the Internet: <http://www.krishnaparkinfracon.com/telcoma-products/>, (Accessed online Oct. 5, 2021), 3 pages.

Overhead Door, "Garage Door Opener Battery Backup", [Online]. Retrieved from the Internet: <https://www.overheaddoor.com/garage-door-opener-battery-backup>, (Accessed online Oct. 5, 2021), 4 pages.

Parks, Mike, "Reasons for Choosing a Direct Current (DC) Garage Door Opener and Things to Look forWhen Comparing Garage Door Openers", [Online]. Retrieved from the Internet: <https://www.abettergaragedoorinc.com/garage-doors/resources/79-reasons-for-choosing-a-direct-current-dc-garage-door-opener>, (Dec. 30, 2016), 5 pages.

Renu Energy Solutions, "Battery Backup for Energy Systems", [Online]. Retrieved from the Internet: <https://renuenergysolutions.com/battery-backup/>, (Accessed online Oct. 5, 2021), 11 pages.

The Genie Company, "Battery Backup GBB-BX", [Online]. Retrieved from the Internet <https://www.geniecompany.com/battery-backup-/Battery-Backup-GBB-BX>, (Accessed online Oct. 5, 2021), 4 pages.

Yoon, Yourim, et al., "Charge Scheduling of an Energy Storage System under Time-of-Use Pricing and a Demand Charge", The Scientific World Journal vol. 2014, Article ID 937329, (Aug. 13, 2014), 10 pages.

* cited by examiner

GARAGE DOOR OPENER BATTERY BACKUP SYSTEM

TECHNICAL FIELD

The present application generally relates to garage door opening systems, and in particular, relates to a battery monitoring system for garage door opening systems.

BACKGROUND

Garage door opening systems are configured to open or close automatically a garage door in response to a trigger from a remote control. A conventional garage door opening system includes control electronics and a motor to control movement of the garage door. This motor and accompanying control electronics is driven by a power supply. To provide reliable power, many automatic doors include a power supply coupled with a battery backup that switches in when the power source is compromised.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
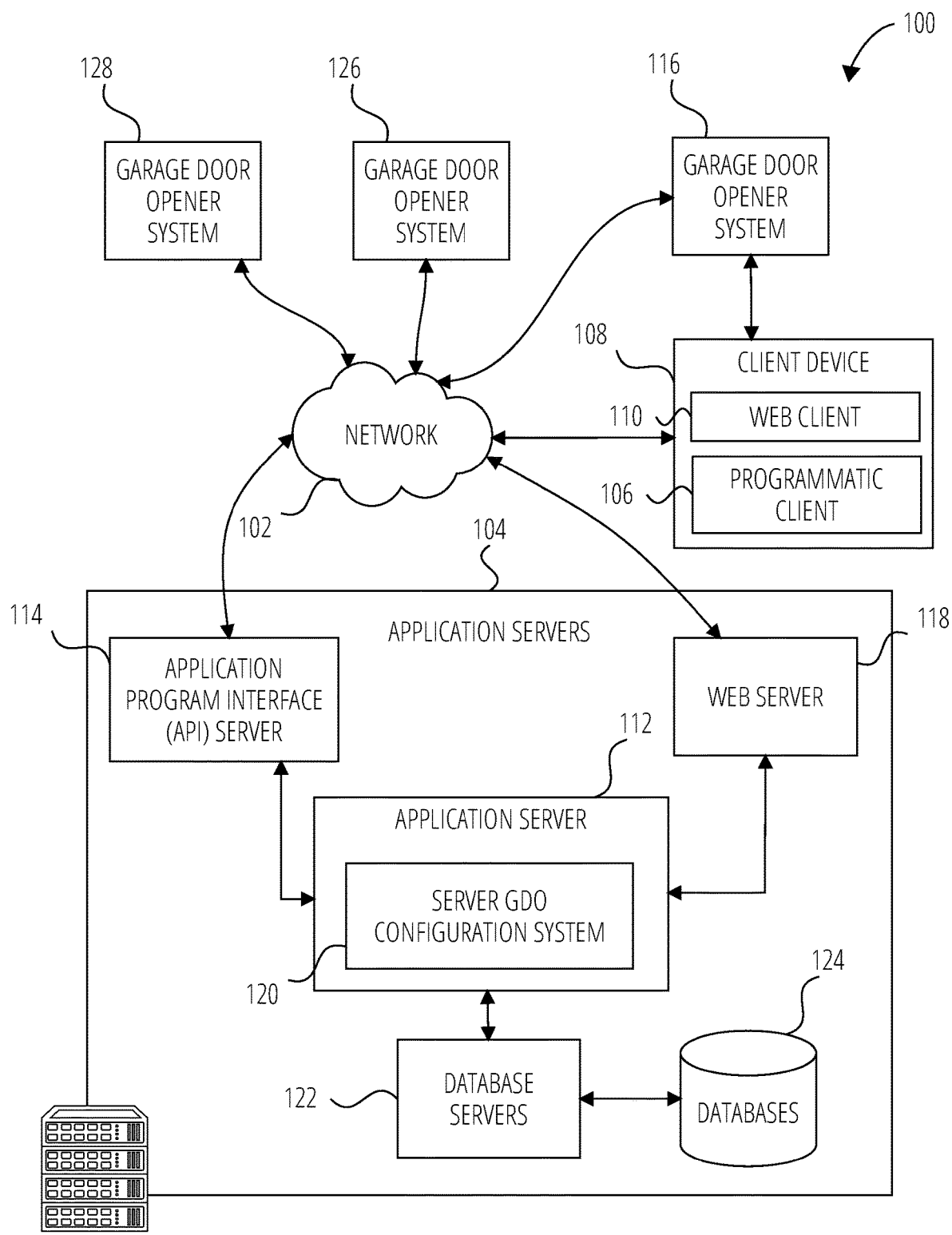
FIG. 1 is a diagrammatic representation of a networked environment in which the present disclosure may be deployed, in accordance with some example embodiments.

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

One major problem with garage door openers (GDO) is the need for preventative maintenance for battery back-ups (also referred to as battery) and other components. Battery back-ups, such as sealed lead acid batteries, are used to provide a source of power if there is an electrical power outage, or other loss of externally supplied power. The batteries are useful, however, only as long as they hold sufficient voltage to operate the garage door operator. Because the battery charges deteriorate over time even without use, they may require recharging or replacement prior to a power outage.

One solution to address this problem is to recharge the batteries so that they are constantly maintained in a charged state and are ready for use. Conventionally, batteries that stand idle for long periods of time are initially charged at a constant high voltage. Over time, as the charge on the battery increases, the charging current is reduced to a "trickle" and the battery is charged more slowly. Trickle charging involves applying a continuous low level of current to the battery.

During ordinary usage (no external power failure), an external power source provides a current to both the battery and the garage door controller/motor. During normal operation, the current is supplied to the garage door controller/motor. When a power failure occurs, a relay switches the connection of the garage door controller/motor to the battery. Because the GDO operates by externally supplied electrical power and because power outages are relatively infrequent, the user may not be aware that the battery is not fully recharged or that the battery needs replacement due to its degraded charging capacity until a next electrical power failure.

The present application describes a GDO system where the charge of the battery is monitored via a serial connection between the external power source, the battery, and the controller/motor. The external power source continuously charges the battery. The battery powers the controller/motor during both normal operation and power failure.

Powering the controller/motor with the battery allows for more accurate measurements of the state of the battery and power consumption by the GDO. For example, a battery monitoring system monitors the battery current consumption at a higher resolution. The battery monitoring system can then predict the number of remaining garage door operations (numbers of openings and closings) based on the state of the battery (e.g., battery holds a max of 80% of original charge, battery is currently at 70%). The battery monitoring system can further notify users of the GDO of power consumption related to the GDO and inform remaining battery life usage. Other examples include predicting the condition of GDO mechanical system (gears, spring, rollers, hinges) based on the power consumption, using machine learning to analyze power consumption and mechanical symptoms, using machine learning models to predict when a component (spring) will break, modifying an operation configuration of the GDO when the battery charge falls below a threshold (e.g., by throttling the speed of opening/closing the garage door, or turning off/dimming light consumption of a light of the GDO based on ambient light, programing the GDO to charge battery based on Time of Use (TOU) schedule.

In one example embodiment, a garage door opener system includes a battery configured to be charged by a power source, a controller coupled to the battery, the controller configured to operate a motor that is powered only by the battery, at least one sensor coupled to the motor and the controller, the at least one sensor generating sensor data, and a battery monitoring system coupled to the battery, the controller, and the least one sensor, the battery monitoring system configured to monitor a power consumption of the battery and a state of the battery, and to update an operation configuration of the controller based on historical power consumption of the battery, the state of the battery, and the sensor data.

FIG. 1 is a diagrammatic representation of a network environment 100 in which some example embodiments of the present disclosure may be implemented or deployed. One or more application servers 104 provide server-side functionality via a network 102 to a networked user device (in the form of a client device 108) connected to a garage door opener system 116. A web client 110 (e.g., a browser) and a programmatic client 106 (e.g., an "app") are hosted and execute on the client device 108. The client device 108 can communicate with the application servers 104 via the network 102 or via other wireless or wired means.

The garage door opener system 116 includes a battery, a controller, a motor, sensors, and a battery monitoring system. The motor operates a mechanism to open and close a garage door. The garage door opener system 116 is described is more detail below with respect to FIG. 2.

An Application Program Interface (API) server 114 and a web server 118 provide respective programmatic and web interfaces to application servers 104. A specific application server 112 hosts a Server GDO configuration system 120 that operates with the application server 112.

In one example embodiment, the Server GDO configuration system 120 receives historical power consumption of batteries, sensor data, and battery state from GDOs (e.g., garage door opener system 126, garage door opener system 128, and garage door opener system 116). The Server GDO configuration system 120 trains a machine learning model based on the historical power consumption of batteries, sensor data, and state of batteries, and generates an operation configuration for a particular GDO based on the machine learning model. For example, the Server GDO configuration system 120 generates an operation configuration for the controller of garage door opener system 116 based on the machine learning model and updated data received from the garage door opener system 116. The Server GDO configuration system 120 uploads the operation configuration to the controller of the corresponding GDO system. In another example, the Server GDO configuration system 120 notifies the client device 108 of the updated operation configuration. In yet another example, the Server GDO configuration system 120 determines that the charging capacity of a battery is below a threshold, and in response notifies the client device 108 of the low charging level of the battery.

In another example embodiment, the operations performed by the Server GDO configuration system 120 may be also performed or distributed to another server or another peer GDO system.

The web client 110 communicates with the Server GDO configuration system 120 via the web interface supported by the web server 118. Similarly, the programmatic client 106 communicates with the Server GDO configuration system 120 via the programmatic interface provided by the Application Program Interface (API) server 114. The application server 112 is shown to be communicatively coupled to database servers 122 that facilitates access to an information storage repository or databases 124 (e.g., GDO battery power consumption, GDO battery state, sensor data, make and model of the motors and other mechanical components). The databases 124 includes storage devices that store information to be published and/or processed by the Server GDO configuration system 120.

Figure 2:
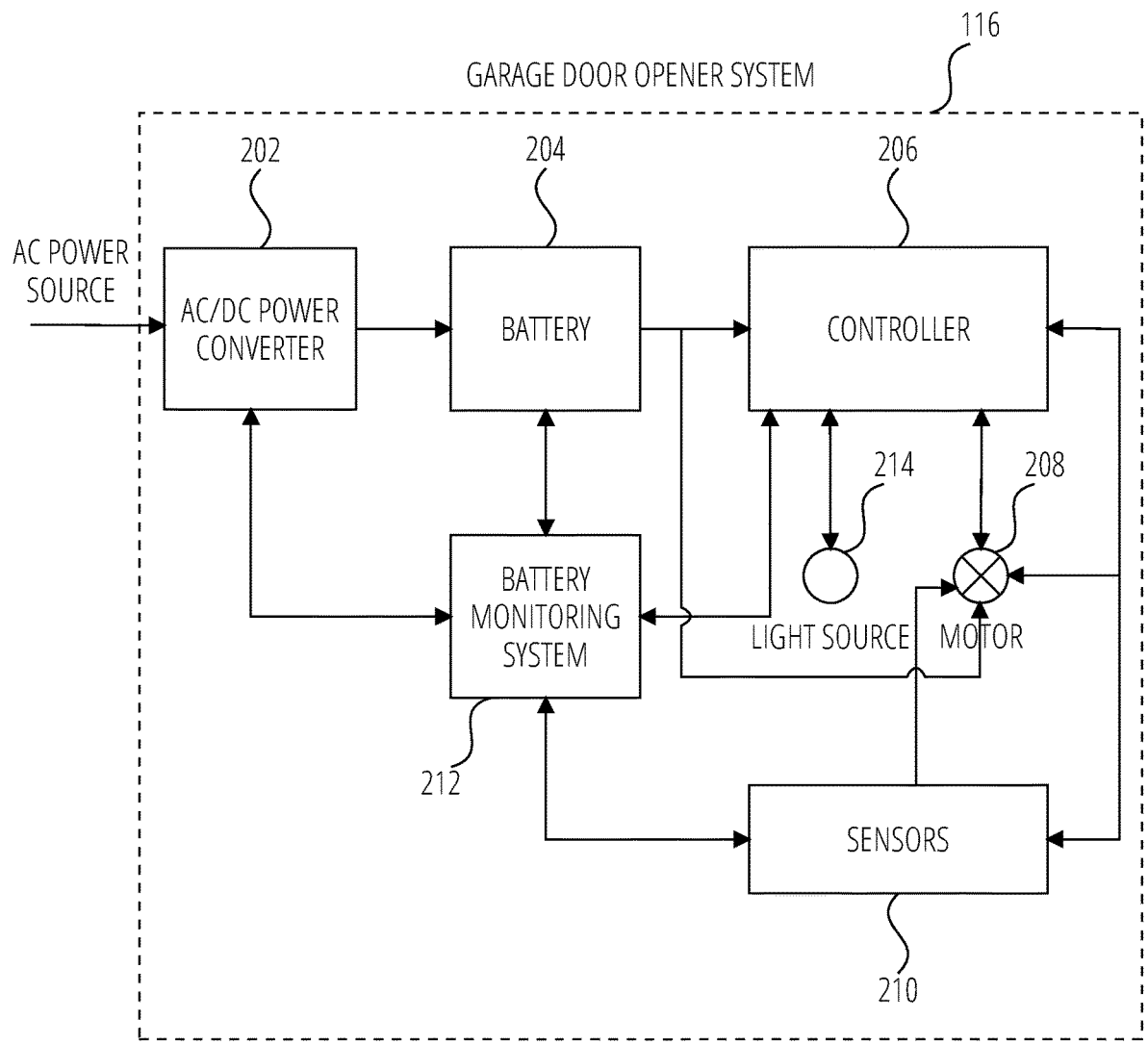
FIG. 2 is a block diagram illustrating a garage door opener system in accordance with one example embodiment.

FIG. 2 is a block diagram illustrating a garage door opener system 116 in accordance with one example embodiment. The garage door opener system 116 includes a garage door opener system 116, an AC/DC power converter 202, a battery 204, a controller 206, a motor 208, a sensors 210, a battery monitoring system 212, and a light source 214. The AC/DC power converter 202 converts AC voltage from an external power source (e.g., AC power source) to a DC voltage. The AC/DC power converter 202 charges the battery 204 with the DC voltage. The battery 204 provides power to the controller 206 and the motor 208. The controller 206 detects a control signal (e.g., via a switch of a wall controller or a wireless receiver). In response to detecting the control signal, the controller 206 provides the motor 208 with power from the battery 204 to operate a garage door (e.g., to open or close a garage door). Sensors 210 include, for example, an obstacle detector, a temperature sensor, and an ambient light sensor. The obstacle detector comprises an emitter and infrared detector. The light source 214 includes, for example, a light bulb.

The battery monitoring system 212 monitors a battery consumption of the battery 204 and a charge state of the battery 204. The battery monitoring system 212 can also receive sensor data from the sensors 210. The battery monitoring system 212 estimates a remaining battery life of the battery 204 and a remaining life of mechanical components (e.g., springs, rollers, gears) of the garage door opener system 116 based on historical power consumption of the motor 208 and sensor data. When the battery monitoring system 212 determines that the remaining battery life is below a threshold, the battery monitoring system 212 generates a notification to the client device 108. The notification indicates that the remaining battery life is below the threshold. In another example, the battery monitoring system 212 generates an updated operation configuration to the controller 206 to provide reduced power to the motor 208. For example, the updated operation configuration configures the controller 206 to reduce power to the motor during both opening and closing, or during opening or closing only. In other examples, the updated configuration reduces power consumption of other electrical components (e.g., light source 214, turning off a modem or wireless communication device) of the garage door opener system 116. The battery monitoring system 212 is described in more detail with respect to FIG. 3 below.

Figure 3:
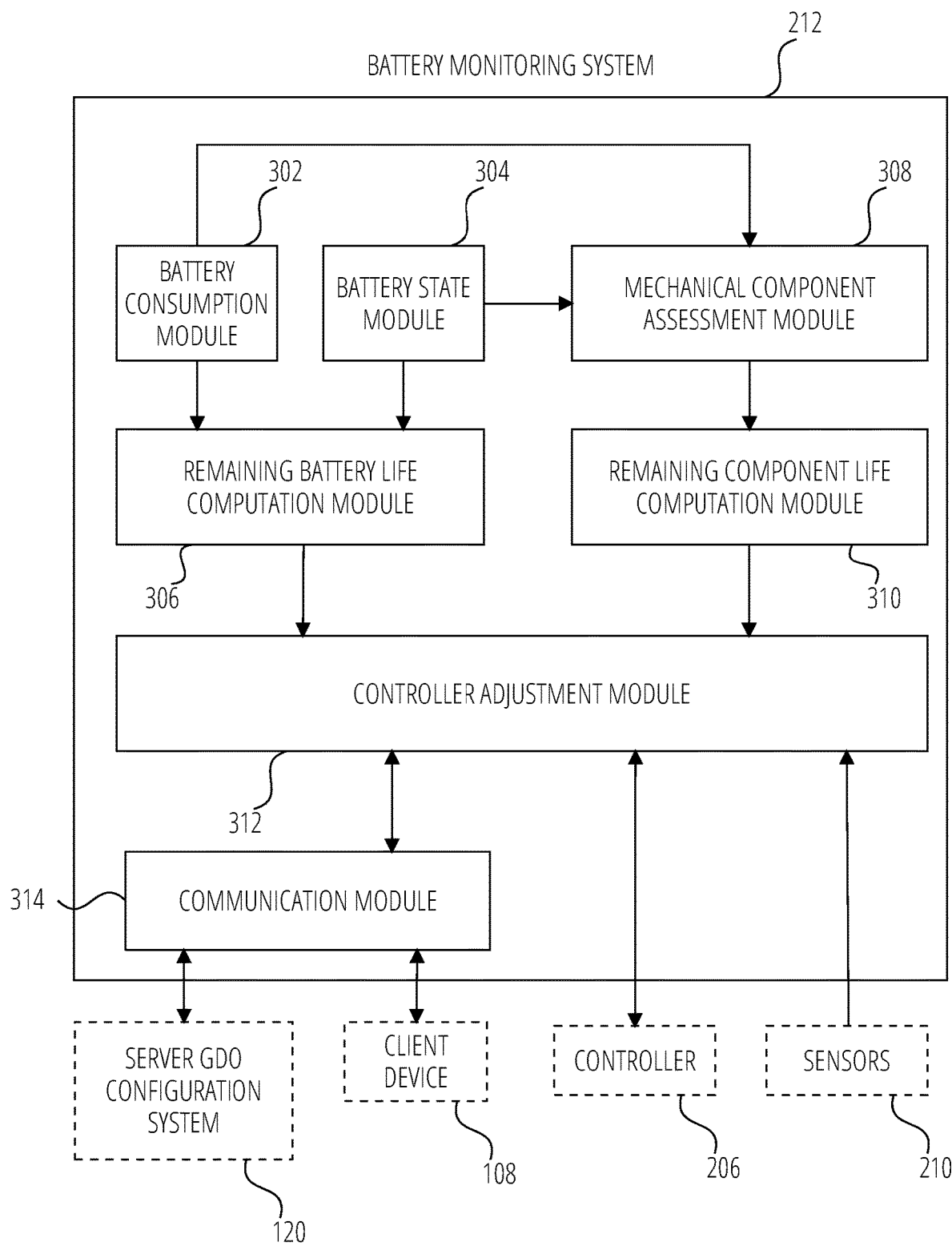
FIG. 3 is a block diagram illustrating a battery monitoring system in accordance with one example embodiment.

FIG. 3 is a block diagram illustrating a battery monitoring system 212 in accordance with one example embodiment. The battery monitoring system 212 includes a battery consumption module 302, a battery state module 304, a remaining battery life computation module 306, a mechanical component assessment module 308, a remaining component life computation module 310, a controller adjustment module 312, and a communication module 314.

The battery consumption module 302 monitors and measures (at a higher accuracy) current drawn from the battery 204 and charge/discharge cycles. The battery state module 304 measures a charge state of the battery 204 (e.g., charged at 60% capacity). The remaining battery life computation module 306 estimates a remaining battery life based on the battery consumption (e.g., charge/discharge cycle) and the current battery state. For example, the remaining battery life computation module 306 determines that the battery now holds a maximum capacity of 80% its original charge. The remaining battery life computation module 306 determines that based on a 50% charge state and a maximum capacity of 80%, the garage door opener system 116 can only open and close the garage door for another 5 times. The remaining battery life computation module 306 determines that the remaining number of garage door operations is below 5, and in response, requests the controller adjustment module 312 to adjust a power consumption of the garage door opener system 116, and requests the communication module 314 to provide a notification to the client device 108 of the adjusted power consumption and the low remaining battery life.

The mechanical component assessment module 308 accesses the data from the battery consumption module 302 and the battery state module 304 to assess whether the condition of a mechanical component is failing and creating more resistance for the motor 208 by measuring power consumption of the motor 208. For example, a spike in power consumption of the motor 208 over the last five openings and closings may indicate a failure in one of the mechanical components. The remaining component life computation module 310 measures the magnitude of the spike to determine and predict a remaining life of a mechanical component. In response to determining that a mechanical component may last only a few more operations, the remaining component life computation module 310 directs the controller adjustment module 312 to modify an operation of the garage door (e.g., by reducing/increasing a speed of the motor, adjusting a speed of the motor at predefined conditions (e.g., when the temperature of the motor is within a threshold), partially opening the garage door for predefined conditions (e.g., to vent the garage).

The controller adjustment module 312 generates an updated operating configuration for the controller 206 based on the remaining battery life computation module 306, the remaining component life computation module 310, and sensor data from sensors 210. The controller adjustment module 312 further communicates with the communication module 314. The communication module 314 includes for example, a wireless communication device (e.g., wireless modem, Bluetooth device, wi-fi modem). The communication module 314 generates a notification to the client device 108. In another example, the communication module 314 uploads the battery consumption data, the battery state, the mechanical assessment data, sensor data to the application server 112 for further processing using machine learning.

Figure 4:
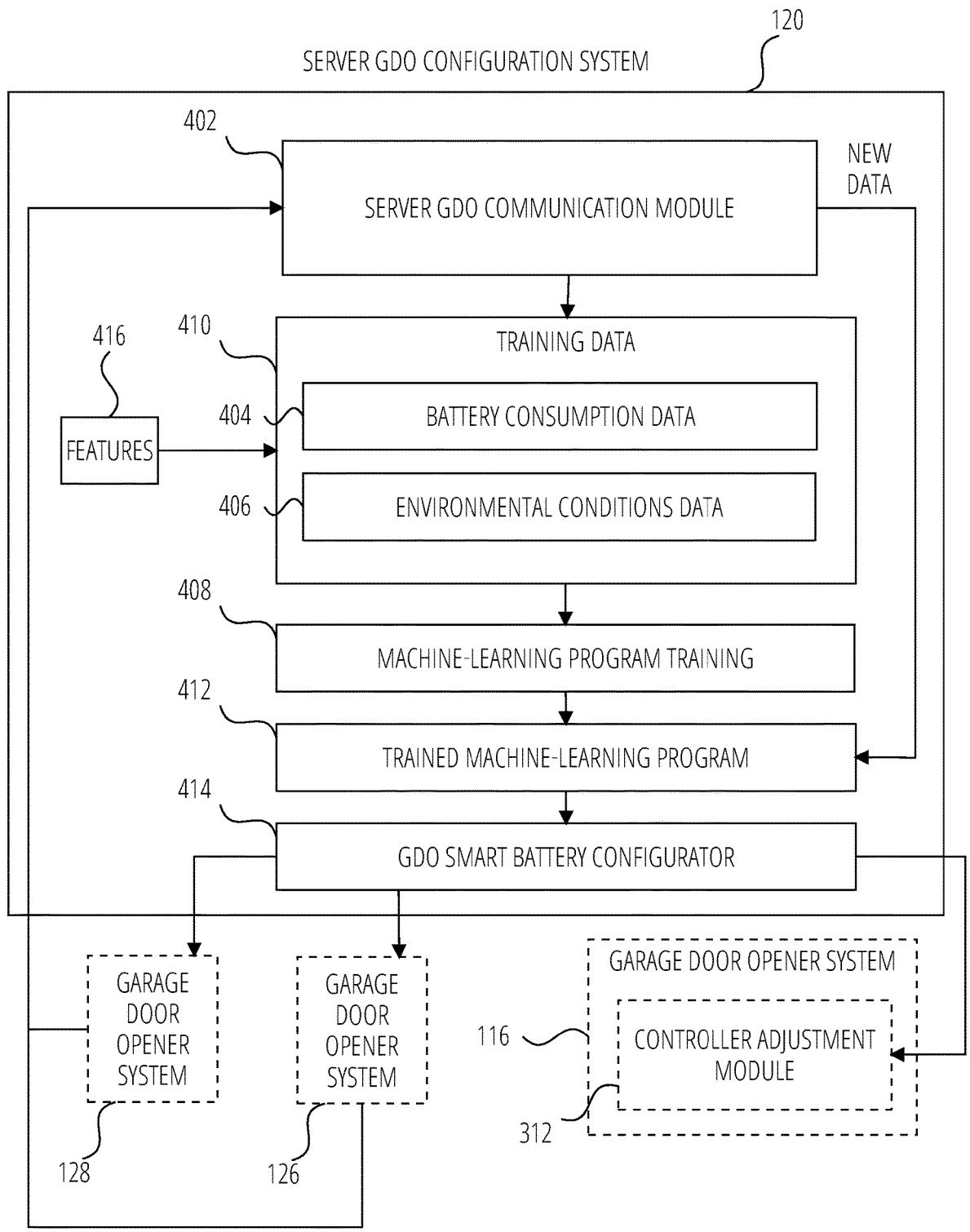
FIG. 4 is a block diagram illustrating a server garage door opener configuration system in accordance with one example embodiment.

FIG. 4 is a block diagram illustrating a server garage door opener configuration system in accordance with one example embodiment. Server GDO configuration system 120 includes a server GDO communication module 402, training data 410, a machine-learning program training 408, features 416, a machine-learning program training 408, a trained machine-learning program 412, and a GDO smart battery configurator 414.

The server GDO communication module 402 receives battery consumption data, the battery state, the mechanical assessment data, sensor data from different GDOs (e.g., garage door opener system 116, garage door opener system 126, and garage door opener system 128). The received data is included in the training data 410 for machine learning. In another example, the training data 410 includes a battery consumption data 404 and an environmental conditions data 406 (e.g., time of use, outside temperature, ambient light).

Machine learning is a field of study that gives computers the ability to learn without being explicitly programmed. Machine learning explores the study and construction of algorithms, also referred to herein as tools, that may learn from existing data and make predictions about new data. Such machine-learning tools operate by building a model from example training data 410 in order to make data-driven predictions or decisions expressed as outputs or assessments (e.g., GDO smart battery configurator 414). Although example embodiments are presented with respect to a few machine-learning tools, the principles presented herein may be applied to other machine-learning tools.

In some example embodiments, different machine-learning tools may be used. For example, Logistic Regression (LR), Naive-Bayes, Random Forest (RF), neural networks (NN), matrix factorization, and Support Vector Machines (SVM) tools may be used for classifying or scoring remaining battery life or garage door operations.

Two common types of problems in machine learning are classification problems and regression problems. Classification problems, also referred to as categorization problems, aim at classifying items into one of several category values (for example, is this object an apple or an orange?). Regression algorithms aim at quantifying some items (for example, by providing a value that is a real number).

The machine-learning algorithms use features 416 for analyzing the data to generate an assessment. Each of the features 416 is an individual measurable property of a phenomenon being observed. The concept of a feature is related to that of an explanatory variable used in statistical techniques such as linear regression. Choosing informative, discriminating, and independent features is important for the effective operation of the MLP in pattern recognition, classification, and regression. Features may be of different types, such as numeric features, strings, and graphs.

In one example embodiment, the features 416 may be of different types and may include one or more of historical data, sensor data, power consumption data, make and model of motor or other mechanical components, user data, merely for example.

The machine-learning algorithms use the training data 410 to find correlations among the identified features 416 that affect the outcome or assessment. In some example embodiments, the training data 410 includes labeled data, which is known data for one or more identified features 416 and one or more outcomes, such as detecting power consumption patterns, detecting battery states, detecting spikes in power consumption related to a mechanical component failure, determining controller configurations, etc.

With the training data 410 and the identified features 416, the machine-learning tool is trained at machine-learning program training 408. The machine-learning tool appraises the value of the features 416 as they correlate to the training data 410. The result of the training is the trained machine-learning program 412.

When the trained machine-learning program 412 is used to perform an assessment, new data (from server GDO communication module 402) is provided as an input to the trained machine-learning program 412, and the trained machine-learning program 412 generates a controller operation configuration as output to the GDO smart battery configurator 414.

The GDO smart battery configurator 414 uploads the new operation configuration to the respective controller (controller adjustment module 312) of the GDOs (e.g., garage door opener system 128, garage door opener system 126).

Figure 5:
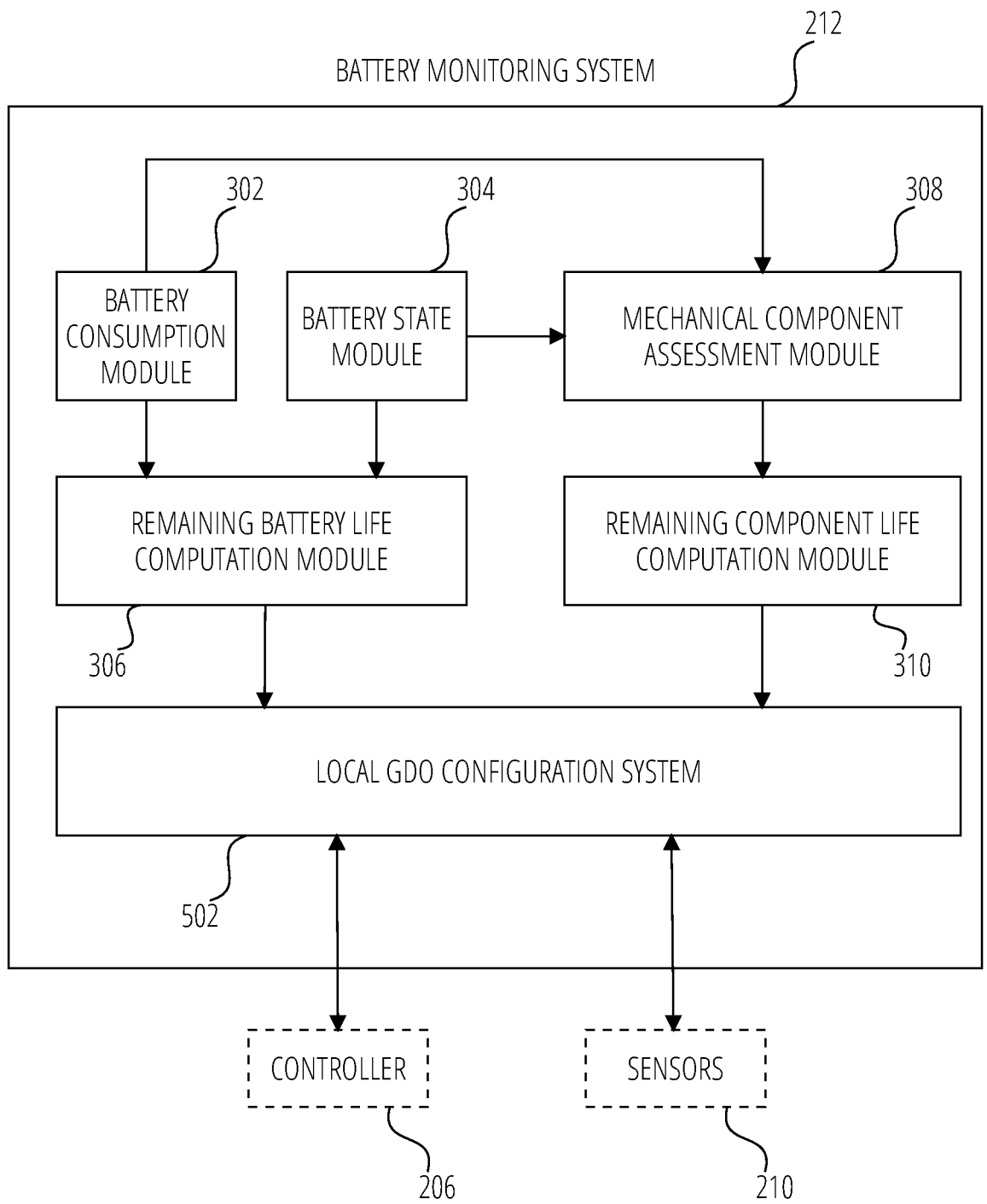
FIG. 5 is a block diagram illustrating a battery monitoring system in accordance with another example embodiment.

FIG. 5 is a block diagram illustrating a battery monitoring system 212 in accordance with another example embodiment. The battery monitoring system 212 includes a battery consumption module 302, a battery state module 304, a remaining battery life computation module 306, a mechanical component assessment module 308, a remaining component life computation module 310, and a local GDO configuration system 502.

The local GDO configuration system 502 communicates with the remaining battery life computation module 306, the remaining component life computation module 310, and sensors 210. In one example, the local GDO configuration system 502 accesses battery consumption data, battery state data, remaining battery life data from remaining battery life computation module 306. The local GDO configuration system 502 accesses mechanical component data and remaining component life data from remaining component life computation module 310. The local GDO configuration system 502 accesses sensor data from sensors 210.

In one example embodiment, the local GDO configuration system 502 generates an updated operating configuration for the controller 206 based on data from the remaining battery life computation module 306, the remaining component life computation module 310, and sensors 210. The local GDO configuration system 502 provides the updated operating configuration to the controller 206. In another example, the local GDO configuration system 502 configures the controller 206 to operate according to the updated operating configuration.

For example, the local GDO configuration system 502 determines that a mechanical component (e.g., a spring) may be reaching the end of its operating lifespan. The local GDO configuration system 502 configures the controller 206 to adjust a speed of the motor 208 (e.g., faster closing and slower opening, or vice-versa, slower opening and closing) to reduce wear and tear on the mechanical component.

In another example, the local GDO configuration system 502 determines that the garage door opener system 116 often operates during specific periods, the local GDO configuration system 502 may configure the motor 208 to operate a default speed during the specific periods, and a slower speed outside the specific periods.

In another example, the local GDO configuration system 502 configures the controller 206 to turn on and off some features (e.g., Wi-Fi, light) at specific times based on sensor data from the sensors 210. For example, the local GDO configuration system 502 learns that the user is at home between 8 pm and 8 am, and therefore turns off the Wi-Fi component of the garage door opener system 116 between 8 pm and 8 am.

In another example, the local GDO configuration system 502 determines an amount of ambient light in the garage from sensors 210, and turns off light source 214 based on the amount of ambient light (e.g., if brighter than a preset brightness).

In another example, the local GDO configuration system 502 accesses rain data from sensors 210 (e.g., a rain sensor) or from a remote server to determine whether it is raining. The local GDO configuration system 502 configures the controller 206 to operate the motor 208 at a faster speed when it rains. In another example, the local GDO configuration system 502 configures the controller 206 to operate the motor 208 at different speeds based on the weather forecast.

In another example, the local GDO configuration system 502 accesses electric utility data to determine time-of-use (TOU) hours. The local GDO configuration system 502 configures the AC/DC power converter 202 to charge the battery 204 only during certain hours based on the TOU hours.

Figure 6:
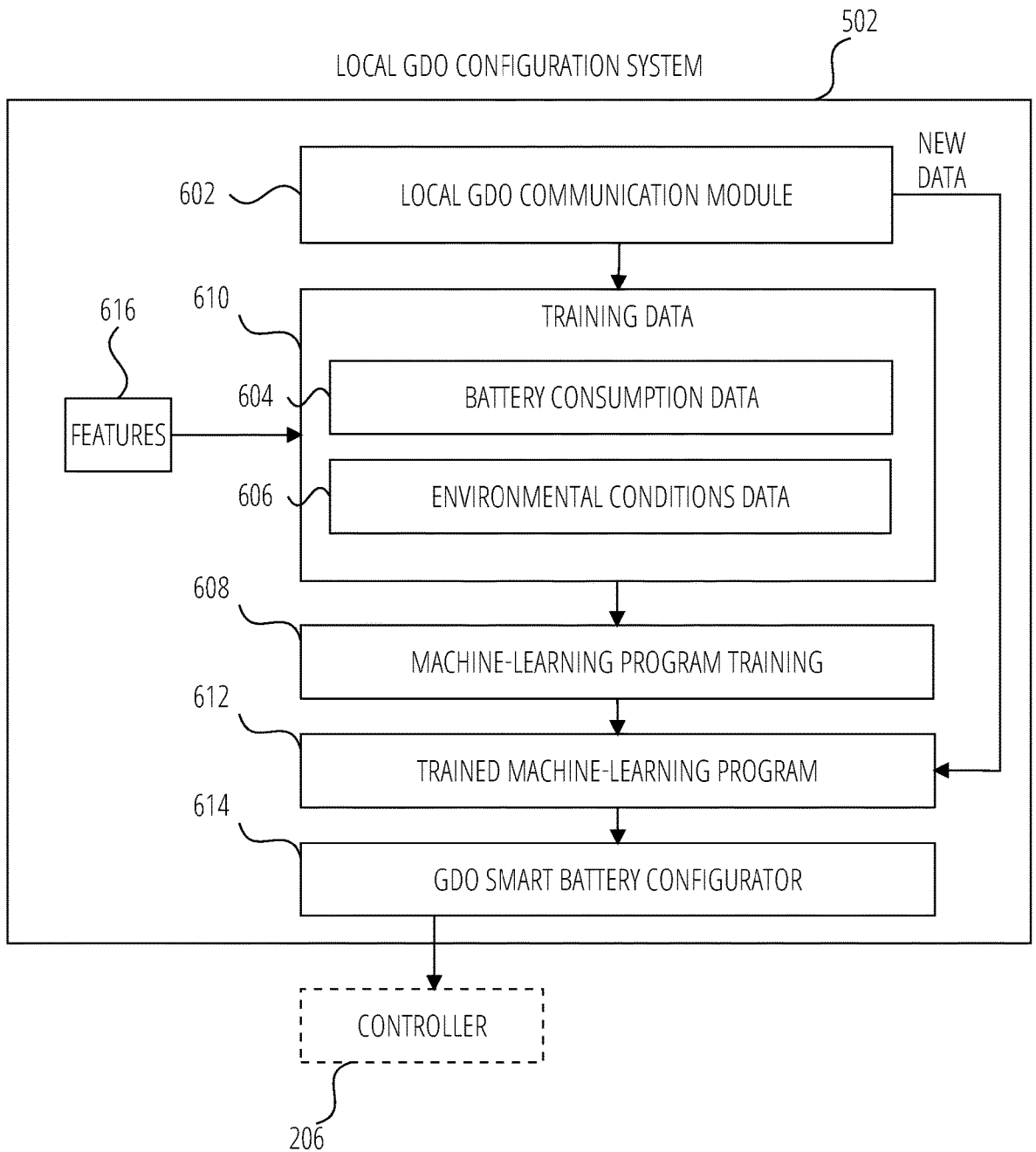
FIG. 6 is a block diagram illustrating a local garage door opener configuration system in accordance with one example embodiment.

FIG. 6 is a block diagram illustrating the local GDO configuration system 502 in accordance with one example embodiment. The local GDO configuration system 502 includes a local GDO communication module 602, training data 610, machine-learning program training 608, features 616, machine-learning program training 608, trained machine-learning program 612, and GDO smart battery configurator 614.

The local GDO communication module 602 receives battery consumption data, the battery state, the mechanical assessment data, sensor data from the different components (e.g., battery consumption module 302, battery state module 304, remaining battery life computation module 306, mechanical component assessment module 308, remaining component life computation module 310, sensors 210) of the garage door opener system 116. The received data is included in the training data 610 for machine learning. In another example, the training data 610 includes battery consumption data 604 and environmental conditions data 606 (e.g., estimated component life, time of use, outside temperature, ambient light).

The machine-learning algorithms use features 616 for analyzing the data to generate an assessment. In one example embodiment, the features 616 may be of different types and may include one or more of historical data, sensor data, power consumption data, make and model of motor or other mechanical components, user data, merely for example.

The machine-learning algorithms use the training data 610 to find correlations among the identified features 616 that affect the outcome or assessment. In some example embodiments, the training data 610 includes labeled data, which is known data for one or more identified features 616 and one or more outcomes, such as detecting power consumption patterns, detecting battery states, detecting spikes in power consumption related to a mechanical component failure, determining controller configurations, etc.

With the training data 610 and the identified features 616, the machine-learning tool is trained at machine-learning program training 608. The machine-learning tool appraises the value of the features 616 as they correlate to the training data 610. The result of the training is the trained machine-learning program 612.

When the trained machine-learning program 612 is used to perform an assessment, new data (from local GDO communication module 602) is provided as an input to the trained machine-learning program 612, and the trained machine-learning program 612 generates a controller operation configuration as output to the GDO smart battery configurator 614.

The GDO smart battery configurator 614 uploads the new operation configuration to controller 206 of the garage door opener system 116 or configures the controller 206 based on the new operation configuration.

Figure 7:
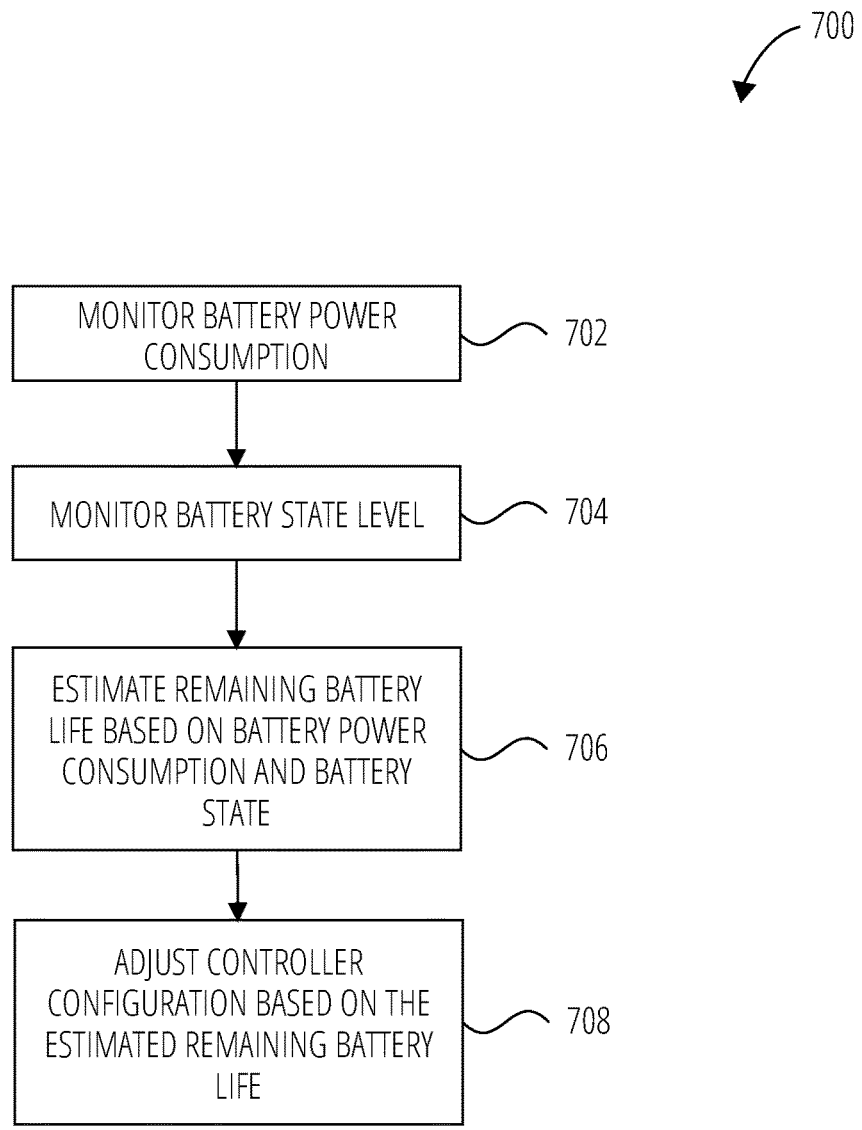
FIG. 7 is a flow diagram illustrating a method for adjusting controller configuration in accordance with one example embodiment.

FIG. 7 is a flow diagram illustrating a method for adjusting controller configuration in accordance with one example embodiment. Operations in the method 700 may be performed by the battery monitoring system 212, using Components (e.g., modules, engines) described above with respect to FIG. 3. Accordingly, the method 700 is described by way of example with reference to the battery monitoring system 212. However, it shall be appreciated that at least some of the operations of the method 700 may be deployed on various other hardware configurations or be performed by similar Components residing elsewhere. For example, some of the operations may be performed at the application server 112 or the client device 108.

In block 702, the battery consumption module 302 monitors battery power consumption. In block 704, the battery state module 304 monitors battery state level. In block 706, the remaining battery life computation module 306 estimates a remaining battery life based on battery power consumption and battery state. In block 708, the controller adjustment module 312 adjusts controller configuration based on the estimated remaining battery life.

Figure 8:
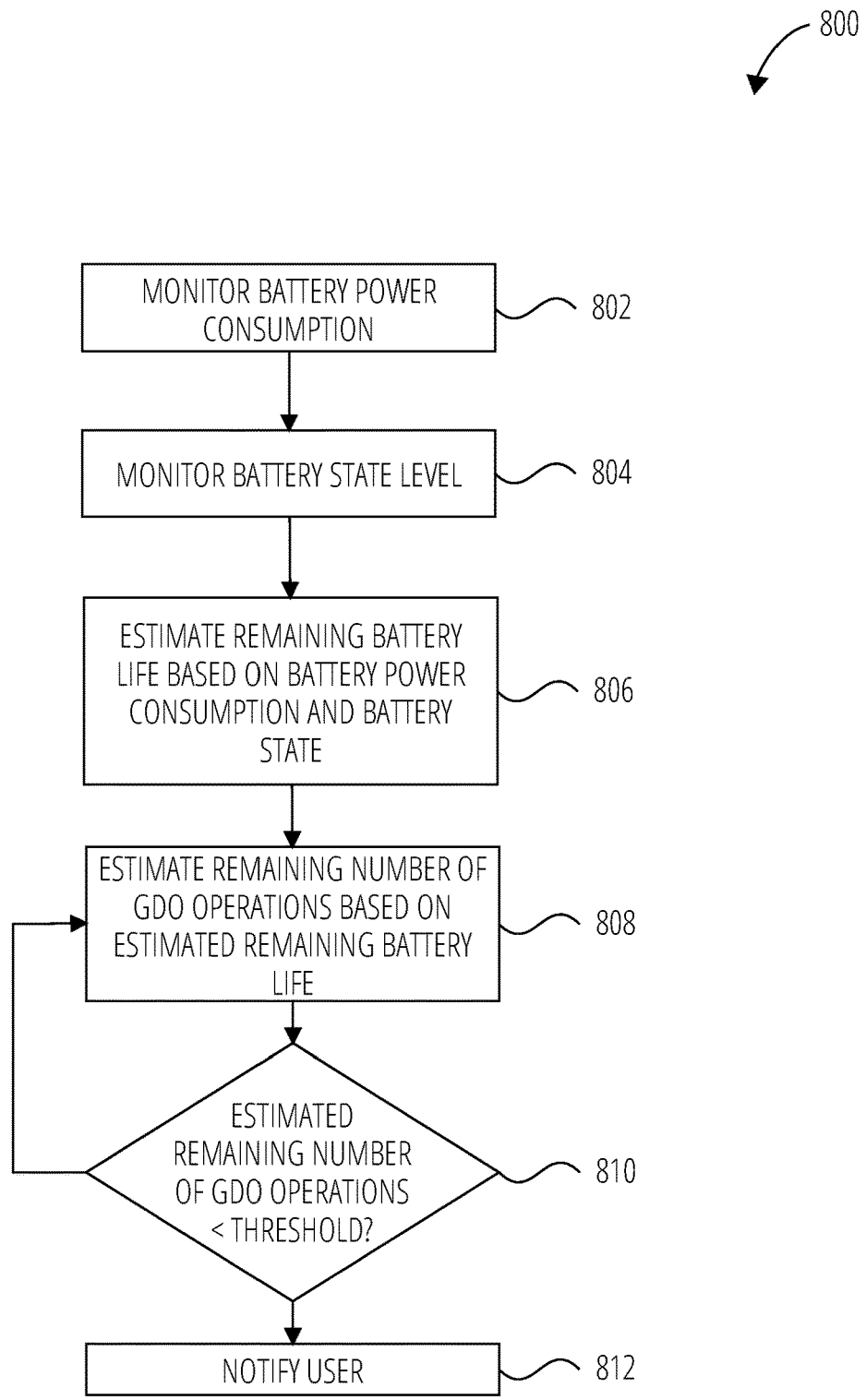
FIG. 8 is a flow diagram illustrating a method for notifying a user in accordance with one example embodiment.

FIG. 8 is a flow diagram illustrating a method for notifying a user in accordance with one example embodiment. Operations in the method 800 may be performed by the battery monitoring system 212, using Components (e.g., modules, engines) described above with respect to FIG. 3. Accordingly, the method 800 is described by way of example with reference to the battery monitoring system 212. However, it shall be appreciated that at least some of the operations of the method 800 may be deployed on various other hardware configurations or be performed by similar Components residing elsewhere. For example, some of the operations may be performed at the application server 112 or the client device 108.

In block 802, the battery consumption module 302 monitors battery power consumption. In block 804, the battery state module 304 monitor battery state level. In block 806, the remaining battery life computation module 306 estimates remaining battery life based on battery power consumption and battery state. In block 808, the remaining battery life computation module 306 estimates a remaining number of GDO operations based on estimated remaining battery life. In decision block 810, the remaining battery life computation module 306 determines whether the estimated remaining number of GDO operations is below a threshold. In block 812, the communication module 314 notifies the user of the garage door opener system 116 in response to determining that the estimated remaining number of GDO operations is below a threshold.

Figure 9:
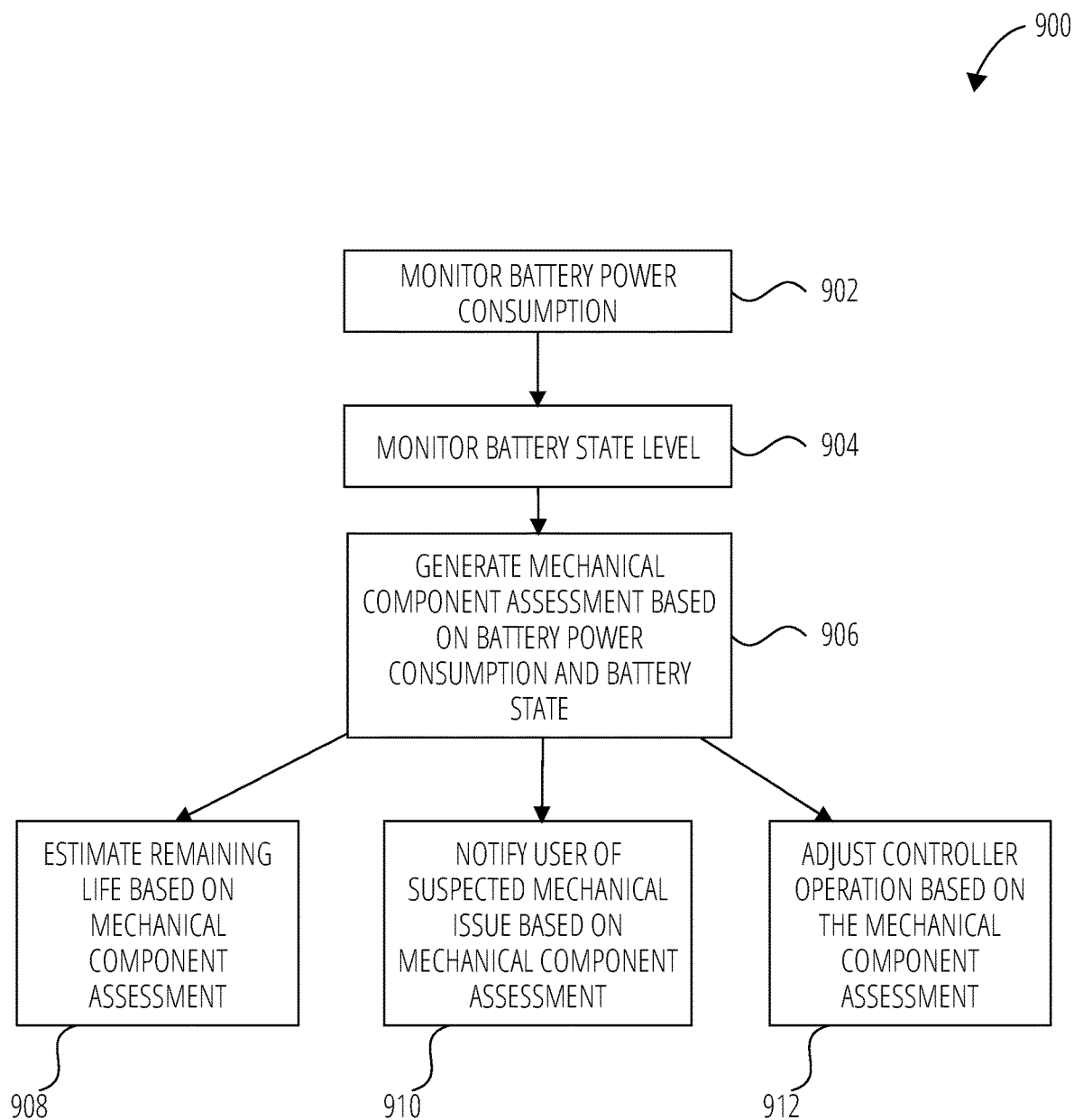
FIG. 9 is a flow diagram illustrating a method for generating a mechanical component assessment in accordance with one example embodiment.

FIG. 9 is a flow diagram illustrating a method for generating a mechanical component assessment in accordance with one example embodiment. Operations in the method 900 may be performed by the battery monitoring system 212, using Components (e.g., modules, engines) described above with respect to FIG. 3. Accordingly, the method 900 is described by way of example with reference to the battery monitoring system 212. However, it shall be appreciated that at least some of the operations of the method 900 may be deployed on various other hardware configurations or be performed by similar Components residing elsewhere. For example, some of the operations may be performed at the application server 112 or the client device 108.

In block 902, the battery consumption module 302 monitors battery power consumption. In block 904, the battery state module 304 monitors battery state level. In block 906, the mechanical component assessment module 308 generates mechanical component assessment based on battery power consumption and battery state. In block 908, the remaining component life computation module 310 estimate remaining life based on mechanical component assessment. In block 910, the communication module 314 notifies user of suspected mechanical issue based on mechanical component assessment. In block 912, the controller adjustment module 312 adjusts the controller operation based on the mechanical component assessment.

Figure 10:
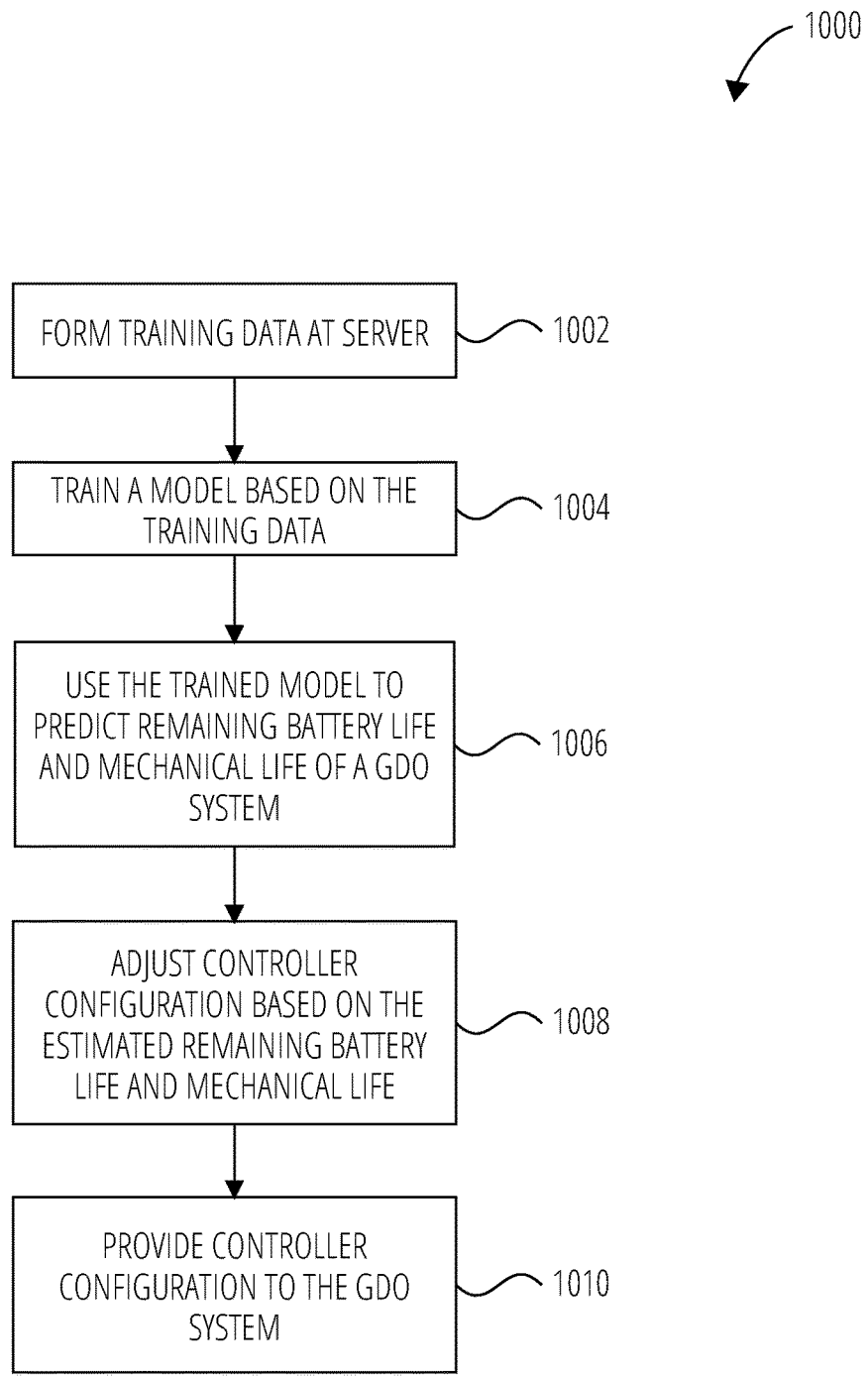
FIG. 10 is a flow diagram illustrating a method for generating controller configuration at a server in accordance with one example embodiment.

FIG. 10 is a flow diagram illustrating a method for generating controller configuration at a server in accordance with one example embodiment. Operations in the method 1000 may be performed by the server GDO configuration system 120, using components (e.g., modules, engines) described above with respect to FIG. 4. Accordingly, the method 1000 is described by way of example with reference to the server GDO configuration system 120. However, it shall be appreciated that at least some of the operations of the method 1000 may be deployed on various other hardware configurations or be performed by similar Components residing elsewhere. For example, some of the operations may be performed at the garage door opener system 116 or the client device 108.

In block 1002, the server GDO communication module 402 forms training data from data received from multiple GDO systems. In block 1004, the machine-learning program training 408 trains a model based on the training data 410 and features 416. In block 1006, the trained machine-learning program 412 uses the trained model to predict remaining battery life and mechanical component life of a GDO system. In block 1008, the GDO smart battery configurator 414 adjusts controller configuration based on the estimated remaining battery life and mechanical component life. In block 1010, the GDO smart battery configurator 414 provides controller configuration to the controller adjustment module 312 of garage door opener system 116.

Figure 11:
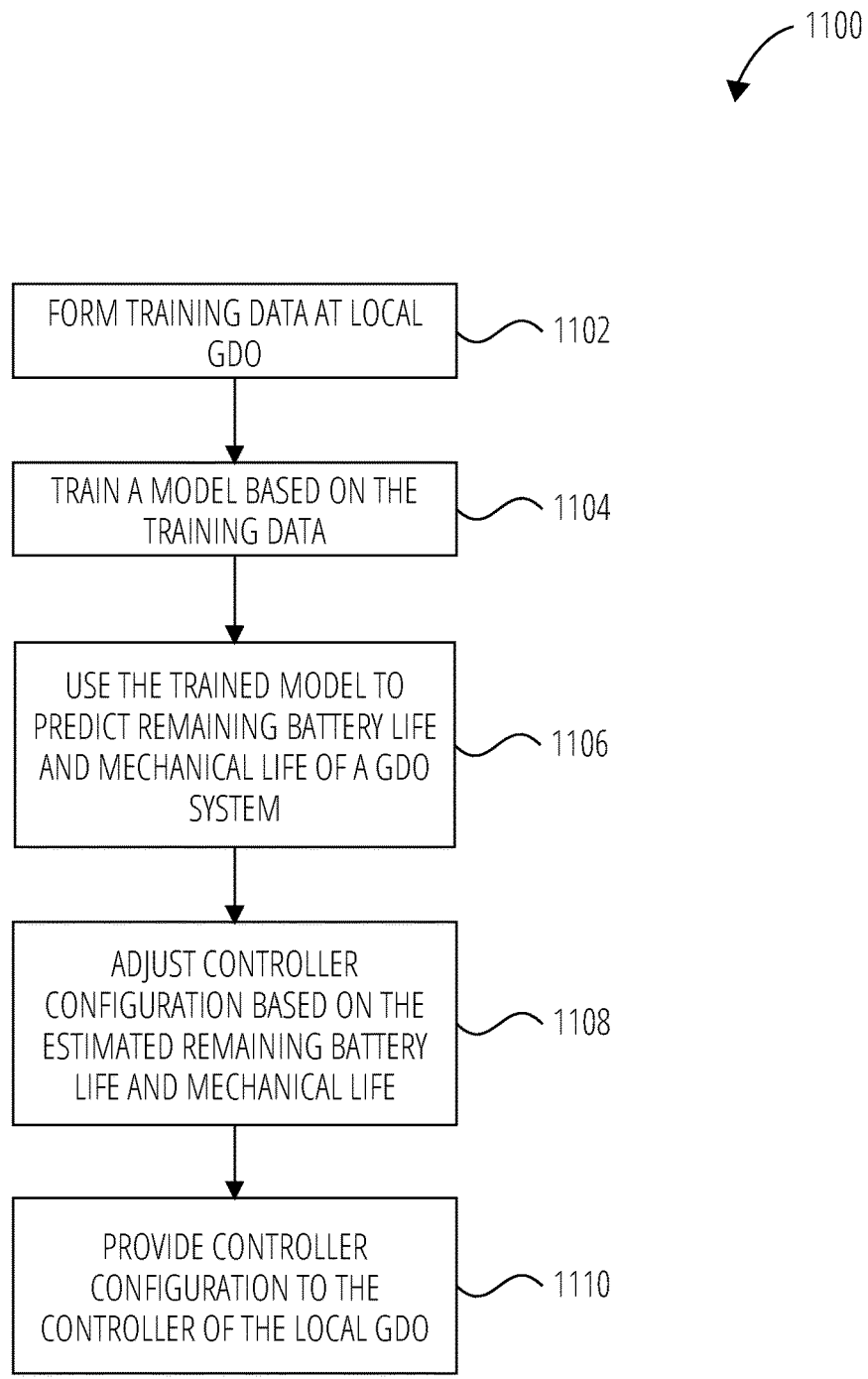
FIG. 11 is a flow diagram illustrating a method for generating controller configuration at a local garage door opener system in accordance with one example embodiment.

FIG. 11 is a flow diagram illustrating a method for generating controller configuration at a local garage door opener system in accordance with one example embodiment. Operations in the method 1100 may be performed by the local GDO configuration system 502, using components (e.g., modules, engines) described above with respect to FIG. 6. Accordingly, the method 1100 is described by way of example with reference to the local GDO configuration system 502. However, it shall be appreciated that at least some of the operations of the method 1100 may be deployed on various other hardware configurations or be performed by similar components residing elsewhere. For example, some of the operations may be performed at the client device 108.

In block 1102, the local GDO configuration system 502 forms training data from data received from components of the garage door opener system 116. In block 1104, the machine-learning program training 608 trains a model based on the training data 610 and features 616. In block 1106, the trained machine-learning program 612 uses the trained model to predict remaining battery life and mechanical component life of a GDO system. In block 1108, the GDO smart battery configurator 614 adjusts controller configuration based on the estimated remaining battery life and mechanical component life. In block 1110, the GDO smart battery configurator 614 provides controller configuration to the controller 206 of the garage door opener system 116.

Figure 12:
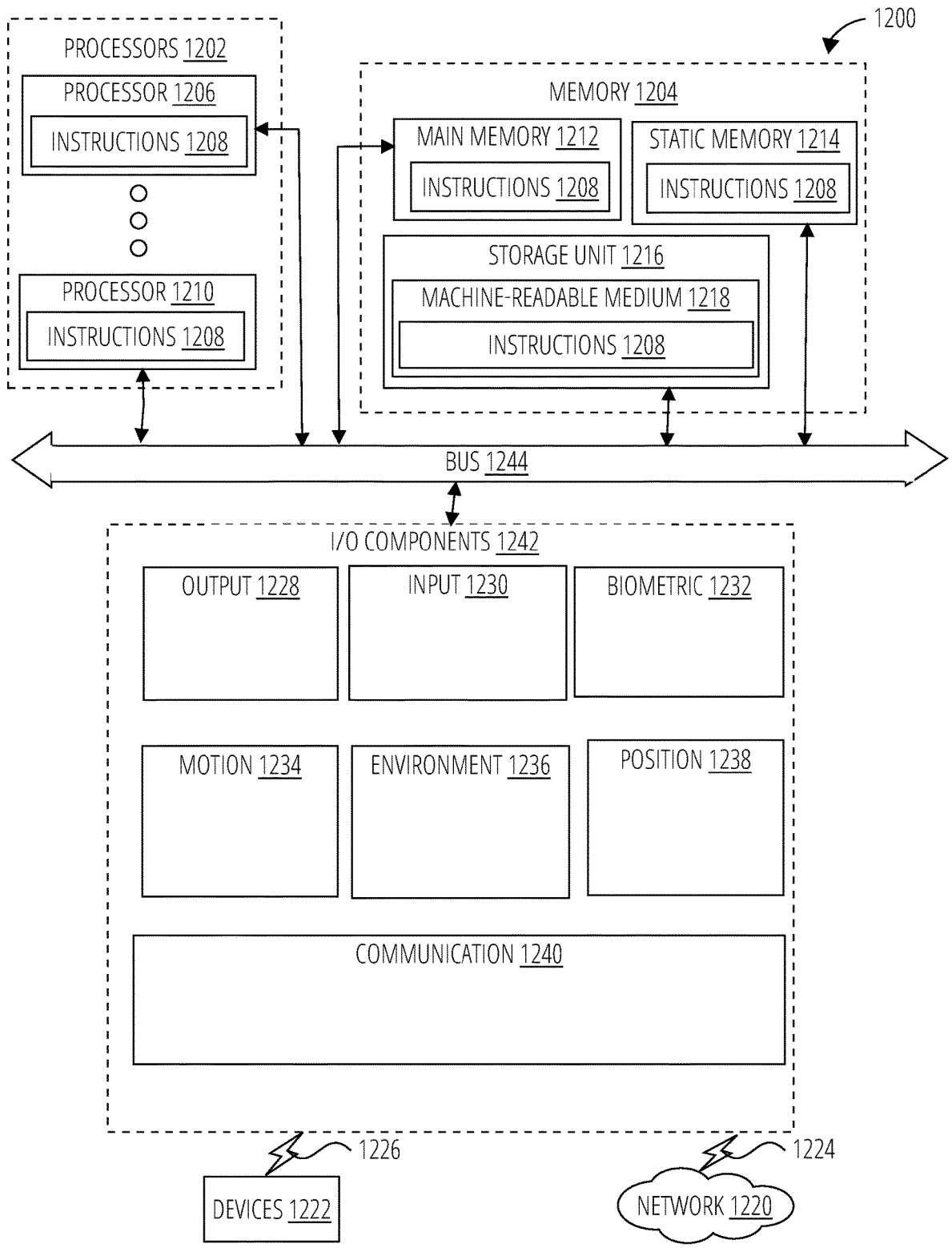
FIG. 12 is a diagrammatic representation of a machine in the form of a computer system within which a set of instructions may be executed for causing the machine to perform any one or more of the methodologies discussed herein, according to an example embodiment.

FIG. 12 is a diagrammatic representation of the machine 1200 within which instructions 1208 (e.g., software, a program, an application, an applet, an app, or other executable code) for causing the machine 1200 to perform any one or more of the methodologies discussed herein may be executed. For example, the instructions 1208 may cause the machine 1200 to execute any one or more of the methods described herein. The instructions 1208 transform the general, non-programmed machine 1200 into a particular machine 1200 programmed to carry out the described and illustrated functions in the manner described. The machine 1200 may operate as a standalone device or may be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1208, sequentially or otherwise, that specify actions to be taken by the machine 1200. Further, while only a single machine 1200 is illustrated, the term "machine" shall also be taken to include a collection of machines that individually or jointly execute the instructions 1208 to perform any one or more of the methodologies discussed herein.

The machine 1200 may include Processors 1202, memory 1204, and I/O Components 1242, which may be configured to communicate with each other via a bus 1244. In an example embodiment, the Processors 1202 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another Processor, or any suitable combination thereof) may include, for example, a Processor 1206 and a Processor 1210 that execute the instructions 1208. The term "Processor" is intended to include multi-core Processors that may comprise two or more independent Processors (sometimes referred to as "cores") that may execute instructions contemporaneously. Although FIG. 12 shows multiple Processors 1202, the machine 1200 may include a single Processor with a single core, a single Processor with multiple cores (e.g., a multi-core Processor), multiple Processors with a single core, multiple Processors with multiples cores, or any combination thereof.

The memory 1204 includes a main memory 1212, a static memory 1214, and a storage unit 1216, both accessible to the Processors 1202 via the bus 1244. The main memory 1204, the static memory 1214, and storage unit 1216 store the instructions 1208 embodying any one or more of the methodologies or functions described herein. The instructions 1208 may also reside, completely or partially, within the main memory 1212, within the static memory 1214, within machine-readable medium 1218 within the storage unit 1216, within at least one of the Processors 1202 (e.g., within the Processor's cache memory), or any suitable combination thereof, during execution thereof by the machine 1200.

The I/O Components 1242 may include a wide variety of Components to receive input, provide output, produce output, transmit information, exchange information, capture measurements, and so on. The specific I/O Components 1242 that are included in a particular machine will depend on the type of machine. For example, portable machines such as mobile phones may include a touch input device or other such input mechanisms, while a headless server machine will likely not include such a touch input device. It will be appreciated that the I/O Components 1242 may include many other Components that are not shown in FIG. 12. In various example embodiments, the I/O Components 1242 may include output Components 1228 and input Components 1230. The output Components 1228 may include visual Components (e.g., a display such as a plasma display panel (PDP), a light emitting diode (LED) display, a liquid crystal display (LCD), a projector, or a cathode ray tube (CRT)), acoustic Components (e.g., speakers), haptic Components (e.g., a vibratory motor, resistance mechanisms), other signal generators, and so forth. The input Components 1230 may include alphanumeric input Components (e.g., a keyboard, a touch screen configured to receive alphanumeric input, a photo-optical keyboard, or other alphanumeric input Components), point-based input Components (e.g., a mouse, a touchpad, a trackball, a joystick, a motion sensor, or another pointing instrument), tactile input Components (e.g., a physical button, a touch screen that provides location and/or force of touches or touch gestures, or other tactile input Components), audio input Components (e.g., a microphone), and the like.

In further example embodiments, the I/O Components 1242 may include biometric Components 1232, motion Components 1234, environmental Components 1236, or position Components 1238, among a wide array of other Components. For example, the biometric Components 1232 include Components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion Components 1234 include acceleration sensor Components (e.g., accelerometer), gravitation sensor Components, rotation sensor Components (e.g., gyroscope), and so forth. The environmental Components 1236 include, for example, illumination sensor Components (e.g., photometer), temperature sensor Components (e.g., one or more thermometers that detect ambient temperature), humidity sensor Components, pressure sensor Components (e.g., barometer), acoustic sensor Components (e.g., one or more microphones that detect background noise), proximity sensor Components (e.g., infrared sensors that detect nearby objects), gas sensors (e.g., gas detection sensors to detection concentrations of hazardous gases for safety or to measure pollutants in the atmosphere), or other Components that may provide indications, measurements, or signals corresponding to a surrounding physical environment. The position Components 1238 include location sensor Components (e.g., a GPS receiver Component), altitude sensor Components (e.g., altimeters or barometers that detect air pressure from which altitude may be derived), orientation sensor Components (e.g., magnetometers), and the like.

Communication may be implemented using a wide variety of technologies. The I/O Components 1242 further include communication Components 1240 operable to couple the machine 1200 to a network 1220 or devices 1222 via a coupling 1224 and a coupling 1226, respectively. For example, the communication Components 1240 may include a network interface Component or another suitable device to interface with the network 1220. In further examples, the communication Components 1240 may include wired communication Components, wireless communication Components, cellular communication Components, Near Field Communication (NFC) Components, Bluetooth® Components (e.g., Bluetooth® Low Energy), Wi-Fi® Components, and other communication Components to provide communication via other modalities. The devices 1222 may be another machine or any of a wide variety of peripheral devices (e.g., a peripheral device coupled via a USB).

Moreover, the communication Components 1240 may detect identifiers or include Components operable to detect identifiers. For example, the communication Components 1240 may include Radio Frequency Identification (RFID) tag reader Components, NFC smart tag detection Components, optical reader Components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection Components (e.g., microphones to identify tagged audio signals). In addition, a variety of information may be derived via the communication Components 1240, such as location via Internet Protocol (IP) geolocation, location via Wi-Fi® signal triangulation, location via detecting an NFC beacon signal that may indicate a particular location, and so forth.

The various memories (e.g., memory 1204, main memory 1212, static memory 1214, and/or memory of the Processors 1202) and/or storage unit 1216 may store one or more sets of instructions and data structures (e.g., software) embodying or used by any one or more of the methodologies or functions described herein. These instructions (e.g., the instructions 1208), when executed by Processors 1202, cause various operations to implement the disclosed embodiments.

The instructions 1208 may be transmitted or received over the network 1220, using a transmission medium, via a network interface device (e.g., a network interface Component included in the communication Components 1240) and using any one of a number of well-known transfer protocols (e.g., hypertext transfer protocol (HTTP)). Similarly, the instructions 1208 may be transmitted or received using a transmission medium via the coupling 1226 (e.g., a peer-to-peer coupling) to the devices 1222.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

EXAMPLES

Example 1 is a garage door opener system comprising: a battery configured to be charged by a power source; a controller coupled to the battery, the controller configured to operate a motor that is powered only by the battery; at least one sensor coupled to the motor and the controller, the at least one sensor generating sensor data; and a battery monitoring system coupled to the battery, the controller, and the least one sensor, the battery monitoring system configured to monitor a power consumption of the battery and a state of the battery, and to update an operation configuration of the controller based on historical power consumption of the battery, the state of the battery, and the sensor data.

Example 2 includes the garage door opener system of example 1, wherein the battery monitoring system is configured to estimate a remaining battery life based on the historical power consumption of the battery, the state of the battery, and the sensor data.

Example 3 includes the garage door opener system of example 2, wherein the battery monitoring system is configured to estimate a remaining number of garage door operations based on the remaining battery life and the state of the battery.

Example 4 includes the garage door opener system of example 3, wherein the battery monitoring system determines that the remaining number of garage door operations is below a threshold, and in response to determining that the remaining number of garage door operations is below the threshold, generates a notification to a user of the garage door opener system, the notification indicating that the remaining number of garage door operations is below the threshold.

Example 5 includes the garage door opener system of example 2, wherein the battery monitoring system determines that the remaining battery life is below a threshold, and in response to determining that the remaining battery life is below the threshold, generate the operation configuration that mitigates power consumption of the battery.

Example 6 includes the garage door opener system of example 5, wherein the operation configuration comprises at least one of throttling a speed of the motor, reducing a power consumption of a component of the garage door opener system, or charging the battery on a predefined schedule.

Example 7 includes the garage door opener system of example 5, wherein the operation configuration comprises dimming a light of the garage door opener based on ambient light sensed by a light sensor of the garage door opener system.

Example 8 includes the garage door opener system of example 1, wherein the battery monitoring system performs a mechanical assessment based historical power consumption of the battery, the sensor data, and the state of the battery, and estimates a remaining mechanical life of a mechanical component of the garage door opener system based on the mechanical assessment.

Example 9 includes the garage door opener system of example 8, wherein the battery monitoring system determines that the remaining mechanical life of the mechanical component is below a threshold, and in response to the remaining mechanical life of the mechanical component being below the threshold, generates a notification to a user of the garage door opener system.

Example 10 includes the garage door opener system of example 1, further comprising: a communication module configured to upload the historical power consumption of the battery, the sensor data, and the state of the battery to a server, the server being configured to receive historical power consumption of batteries, sensor data, and state of batteries from a plurality of garage door opener systems, to train a machine learning model based on the historical power consumption of batteries, sensor data, and state of batteries, and to generate the operation configuration based on the machine learning model.

Example 11 is a computer-implemented method comprising: monitoring a power consumption of a battery of a garage door opener system, and a state of the battery, the battery being configured to be charged by a power source; updating an operation configuration of a controller of the garage door opener system based on the power consumption of the battery, the state of the battery, and sensor data, the controller being coupled to the battery and a motor, the motor being powered only by the battery; and generating the sensor data with at least one sensor coupled to the motor and the controller.

Example 12 includes the computer-implemented method of example 11, further comprising: estimating a remaining battery life based on the historical power consumption of the battery, the state of the battery, and the sensor data.

Example 13 includes the computer-implemented method of example 12, further comprising: estimating a remaining number of garage door operations based on the remaining battery life and the state of the battery.

Example 14 includes the computer-implemented method of example 13, further comprising: determines that the remaining number of garage door operations is below a threshold; and in response to determining that the remaining number of garage door operations is below the threshold, generating a notification to a user of the garage door opener system, the notification indicating that the remaining number of garage door operations is below the threshold.

Example 15 includes the computer-implemented method of example 12, further comprising: determining that the remaining battery life is below a threshold; and in response to determining that the remaining battery life is below the threshold, generating the operation configuration that mitigates power consumption of the battery.

Example 16 includes the computer-implemented method of example 15, wherein the operation configuration comprises at least one of throttling a speed of the motor, reducing a power consumption of a component of the garage door opener system, or charging the battery on a predefined schedule.

Example 17 includes the computer-implemented method of example 15, wherein the operation configuration comprises dimming a light of the garage door opener based on ambient light sensed by a light sensor of the garage door opener system.

Example 18 includes the computer-implemented method of example 11, further comprising performing a mechanical assessment based historical power consumption of the battery, the sensor data, and the state of the battery; estimating a remaining mechanical life of a mechanical component of the garage door opener system based on the mechanical assessment; determining that the remaining mechanical life of the mechanical component is below a threshold; and in response to the remaining mechanical life of the mechanical component being below the threshold, generating a notification to a user of the garage door opener system.

Example 19 includes the computer-implemented method of example 11, further comprising: uploading the historical power consumption of the battery, the sensor data, and the state of the battery to a server, the server being configured to receive historical power consumption of batteries, sensor data, and state of batteries from a plurality of garage door opener systems, to train a machine learning model based on the historical power consumption of batteries, sensor data, and state of batteries, and to generate the operation configuration based on the machine learning model; and downloading the operation configuration from the server.

Example 20 is a non-transitory computer-readable storage medium, the computer-readable storage medium including instructions that when executed by a computer, cause the computer to: monitor a power consumption of a battery of a garage door opener system, and a state of the battery, the battery being configured to be charged by a power source; update an operation configuration of a controller of the garage door opener system based on the power consumption of the battery, the state of the battery, and sensor data, the controller being coupled to the battery and a motor, the motor being powered only by the battery; and generate the sensor data with at least one sensor coupled to the motor and the controller.

What is claimed is:

1. A garage door opener system comprising:
  a motor configured to be coupled to a garage door to open and close the garage door;
  a battery configured to be charged by a power source;
  a controller coupled to the battery, the controller configured to operate the motor in accordance with an operation configuration stored by the controller, the motor powered only by the battery;
  at least one sensor coupled to the motor and the controller, the at least one sensor generating sensor data; and
  a battery monitoring system coupled to the battery, the controller, and the least one sensor, the battery monitoring system configured
    to monitor a power consumption of the battery and a state of the battery,
    to estimate a remaining battery life based on a historical power consumption of the battery, the state of the battery, and the sensor data,
    to estimate a remaining number of garage door operations based on the remaining battery life and the state of the battery, and
    to update the operation configuration of the controller based on the remaining battery life.

2. The garage door opener system of claim 1, wherein the battery monitoring system determines that the remaining number of garage door operations is below a threshold, and in response to determining that the remaining number of garage door operations is below the threshold, generates a notification to a user of the garage door opener system, the notification indicating that the remaining number of garage door operations is below the threshold.

3. The garage door opener system of claim 1, wherein the battery monitoring system determines that the remaining battery life is below a threshold, and in response to determining that the remaining battery life is below the threshold, generate an operation configuration that mitigates power consumption of the battery.

4. The garage door opener system of claim 3, wherein the operation configuration comprises at least one of throttling a speed of the motor, reducing a power consumption of a component of the garage door opener system, or charging the battery on a predefined schedule.

5. The garage door opener system of claim 3, wherein the operation configuration comprises dimming a light of the garage door opener based on ambient light sensed by a light sensor of the garage door opener system.

6. The garage door opener system of claim 1, wherein the battery monitoring system performs a mechanical assessment based historical power consumption of the battery, the sensor data, and the state of the battery, and estimates a remaining mechanical life of a mechanical component of the garage door opener system based on the mechanical assessment.

7. The garage door opener system of claim 6, wherein the battery monitoring system determines that the remaining mechanical life of the mechanical component is below a threshold, and in response to the remaining mechanical life of the mechanical component being below the threshold, generates a notification to a user of the garage door opener system.

8. The garage door opener system of claim 1, further comprising:
a communication module configured to upload the historical power consumption of the battery, the sensor data, and the state of the battery to a server,
the server being configured to receive historical power consumption of batteries, sensor data, and state of batteries from a plurality of garage door opener systems, to train a machine learning model based on the historical power consumption of batteries, sensor data, and state of batteries, and to generate the operation configuration based on the machine learning model.

9. A computer-implemented method comprising:
generating sensor data with at least one sensor coupled to a motor and a controller, wherein the sensor, the motor, the controller and a battery comprise a garage door opener system in which the motor is only powered by the battery and is configured to be coupled to a garage door to open and close the garage door, and wherein the controller is coupled to the battery and the motor and configured to operate the motor in accordance with an operation configuration stored by the controller;
monitoring a power consumption of the battery of the garage door opener system, and a state of the battery, the battery being configured to be charged by a power source;
estimating a remaining battery life based on a historical power consumption of the battery, the state of the battery, and the sensor data;
estimating a remaining number of garage door operations based on the remaining battery life and the state of the battery;
determining that the remaining battery life is below a threshold;
in response to determining that the remaining battery life is below the threshold,
updating the operation configuration to mitigate power consumption of the battery by the motor.

10. The computer-implemented method of claim 9, further comprising:
determines that the remaining number of garage door operations is below a threshold; and
in response to determining that the remaining number of garage door operations is below the threshold, generating a notification to a user of the garage door opener system, the notification indicating that the remaining number of garage door operations is below the threshold.

11. The computer-implemented method of claim 9, wherein the operation configuration comprises at least one of throttling a speed of the motor, reducing a power consumption of a component of the garage door opener system, or charging the battery on a predefined schedule.

12. The computer-implemented method of claim 9, wherein the operation configuration comprises dimming a light of the garage door opener based on ambient light sensed by a light sensor of the garage door opener system.

13. The computer-implemented method of claim 9, further comprising
performing a mechanical assessment based historical power consumption of the battery, the sensor data, and the state of the battery;
estimating a remaining mechanical life of a mechanical component of the garage door opener system based on the mechanical assessment;
determining that the remaining mechanical life of the mechanical component is below a threshold; and
in response to the remaining mechanical life of the mechanical component being below the threshold, generating a notification to a user of the garage door opener system.

14. The computer-implemented method of claim 9, further comprising:
uploading the historical power consumption of the battery, the sensor data, and the state of the battery to a server, the server being configured to receive historical power consumption of batteries, sensor data, and state of batteries from a plurality of garage door opener systems, to train a machine learning model based on the historical power consumption of batteries, sensor data, and state of batteries, and to generate the operation configuration based on the machine learning model; and
downloading the operation configuration from the server.

15. A non-transitory computer-readable storage medium, the computer-readable storage medium including instructions that when executed by a computer, cause the computer to:
generate sensor data with at least one sensor coupled to a motor and a controller, wherein the at least one sensor, the motor, the controller and a battery comprise a garage door opener system in which the motor is only powered by the battery and is configured to be coupled to a garage door to open and close the garage door, and wherein the controller is coupled to the battery and the motor and configured to operate the motor in accordance with an operation configuration stored by the controller;

monitor a power consumption of the battery of the garage door opener system, and a state of the battery, the battery being configured to be charged by a power source;
estimate a remaining life of the battery based on a historical power consumption of the battery, the state of the battery, and the sensor data;
estimate a remaining number of garage door operations based on the remaining battery life and the state of the battery;
determine that the remaining battery life is below a threshold;
in response to determining that the remaining battery life is below the threshold,
   update the operation configuration to mitigate power consumption of the battery by the motor.

\* \* \* \* \*